United States Patent [19]
Mead et al.

[11] Patent Number: 5,276,407
[45] Date of Patent: Jan. 4, 1994

[54] SENSE AMPLIFIER

[75] Inventors: Carver A. Mead, Pasadena; Federico Faggin, Los Altos Hills, both of Calif.

[73] Assignee: Synaptics, Incorporated, San Jose, Calif.

[21] Appl. No.: 900,917

[22] Filed: Jun. 18, 1992

Related U.S. Application Data

[60] Division of Ser. No. 755,306, Sep. 5, 1991, which is a continuation-in-part of Ser. No. 657,128, Feb. 19, 1991, Pat. No. 5,097,305.

[51] Int. Cl.$^5$ .............................................. H03F 3/08
[52] U.S. Cl. .................................. 330/308; 330/110; 307/494
[58] Field of Search ............... 330/308, 59, 110, 277; 307/490, 494, 497, 530

[56] References Cited

U.S. PATENT DOCUMENTS 4,876,534  10/1989  Mead et al. .................. 307/494 X
4,935,702   6/1990  Mead et al. .................. 330/308 X

FOREIGN PATENT DOCUMENTS

0041213  2/1986  Japan ................................. 330/308

*Primary Examiner*—Steven Mottola
*Attorney, Agent, or Firm*—Kenneth D'Alessandro

[57] ABSTRACT

A plurality of integrating photosensors is disposed in an array of rows and columns, with a given row select line connected to the gates of P-channel MOS transistors associated with that given row and a given column sense line connected to the drains of the P-channel MOS transistors associated with that given column. A sense amplifier is associated with each column. An integrating sense amplifier according to the present invention includes an amplifying element having an inverting input and a non-inverting input. The non-inverting input is connected to a source of reference voltage the inverting input is connected to a sense line. A P-channel balance transistor is connected between the inverting input and the output of the amplifying element and a capacitor is also connected between the inverting input and output of the amplifying element. A capacitor, preferably a varactor element, is connected between the output and the inverting input of the amplifying element. An exponential feedback element may be provided in the sense amplifiers for signal compression at high light levels.

13 Claims, 5 Drawing Sheets

SENSE AMPLIFIER

RELATED APPLICATIONS

This application is a division of co-pending application Ser. No. 07/755,306, filed Sep. 5, 1991, which is a continuation-in-part of application Ser. No. 07/657,128, filed Feb. 19, 1991 now U.S. Pat. No. 5,097,305.

BACKGROUND OF THE INVENTION

1. Field Of The Invention

The present invention relates to imaging arrays and systems. More particularly, the present invention relates to a single chip high-sensitivity imaging system for producing serial-scanned outputs.

2. The Prior Art

Imaging circuits typically include a two-dimensional array of photosensors, each of which converts a pixel of light energy from an image into an electrical signal representing the light value of the pixel. The imaging circuit scans the photosensors to read out the electrical signals representing the light values of all pixels from an image.

As a result of the advances in semiconductor technology, single chip imaging circuits are known in the art. The most common single chip imaging technology is the charge coupled device (CCD) camera. A CCD device operates by accumulating photo-generated charge in potential wells in a semiconductor substrate at or slightly under the surface of the substrate. The depth of these wells is controlled by the voltage on gate electrodes located just above the surface of the substrate. By manipulating the voltage on several of the gates, the accumulated charge can be shifted along the surface to a sensing point, where it is amplified into a signal which can be driven off of the chip.

Using modern MOS processing techniques, the transport of charge in a CCD structure can be accomplished with almost perfect efficiency at video rates; typically less than ten parts per million of the charge in a well is lost in each transfer. In a typical serial-scanned CCD imager, such as is used for video applications, the charge is shifted out once per frame, and hence the total charge in each well is collected over the entire frame time, typically 1/60 second. Sensing technologies which operate in this manner, by accumulating charge over the entire time between scanout events, are called integrating photosensors.

Despite its technical achievements and wide spread commercial success, CCD technology has its limitations. Because the photo-generated charge is shifted directly, the gain of the device (electrons out per photon in) is always less than unity. Because the charge stored in each well is limited, the CCD imager has severe dynamic-range constraints. At the low end, the sensitivity is limited by how small a charge can be sensed above the noise of the readout amplifier. At the high end, the range is limited by the total charge that can be shifted from one well into the next.

To overcome these dynamic-range limitations of the CCD imager, a number of attempts have been made to use phototransistors to sense incoming light, such as seen in *Analog VLSI and Neural Systems*, by Carver A. Mead, Addison Wesley Publishing Co., 1989, at pp. 260–261. Phototransistors can have a gain of over 100 electrons per absorbed photon. In a typical application, the photocurrent from each phototransistor is fed into a device with exponential current-voltage characteristics, such as a pair of diode-connected MOS transistors. The output voltage of such a device is then a logarithmic function of the light level. These devices show much wider dynamic rage than do CCD devices, but are not as sensitive at low light levels because they operate in instantaneous-current mode rather than in integrating mode.

Photons absorbed in the neighborhood of a phototransistor collector-base or emitter-base junction create electron-hole pairs that are collected by the nearest p-n junction. Minority carriers collected by either junction act as base current, and are multiplied by the current gain of the transistor to produce the collector current. The emitter current is the sum of the base current and the collector current. For this reason, the emitter current is usually used as the output of the sensor.

Prior art phototransistor sensors suffer from low-current limitations. The current-gain of the phototransistor sensor device is high at high photocurrents, where it is not needed, and is low at low photocurrents, where it would desirably be higher. Because of this behavior of phototransistors, they have not found widespread use in commercial scanned imagers.

It is an object of the present invention to provide an improved single-chip serial-scanned imager, which can exhibit higher sensitivity at lower light levels than current mode imagers, and in the same device operate over a dynamic range larger than that achievable with CCD imagers.

BRIEF DESCRIPTION OF THE INVENTION

According to a first aspect of the present invention, an array of rows and columns of integrating photosensors is coupled to plurality of sense amplifiers with a sense amplifier connected to the sense line output of each column of integrating photosensors. An integrating sense amplifier according to the present invention includes an amplifying element having an inverting input is connected to the sense line. A P-channel balance transistor is connected between the inverting input and the output of the amplifying element and a capacitor, preferably a varactor, is also connected between the inverting input and output of the amplifying element. In addition, in order to further extend the dynamic range, an exponential feedback element can be connected between the output and the inverting input of the amplifying element. In one embodiment of the invention, this feedback element includes a first P-channel feedback transistor having its source connected to the sense line and its gate and drain connected together to the source of a second P channel feedback transistor. The gate of the second P-channel feedback transistor is connected to the output of the amplifying element, and its drain is connected to a fixed voltage source, such as ground. In another embodiment of the invention, this feedback element includes an N-channel MOS transistor having its source connected to the output of the amplifying element, its drain connected to the input of the amplifying element, and its gate connected to a source of fixed voltage.

DETAILED DESCRIPTION OF A PREFERRED EMBODIMENT

Figure 1:
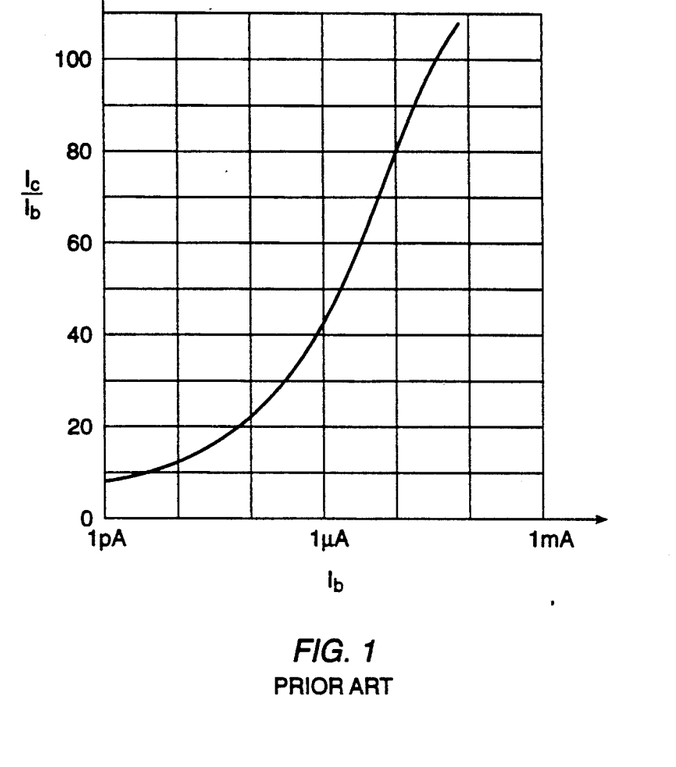
FIG. 1 is a graph showing the measured current gain of a typical phototransistor sensor device as a function of its base current.

The low-current limitation of a prior art phototransistor photosensor can be appreciated with reference to FIG. 1, which shows the measured current gain of a typical phototransistor sensor device as a function of its base current. It can be seen that the current-gain of the phototransistor photosensor device is high at high photocurrents, where it is not needed, and is low at low photocurrents, where it would desirably be higher. Because of this behavior, phototransistors have not found widespread use in commercial scanned imagers.

Figure 2A:
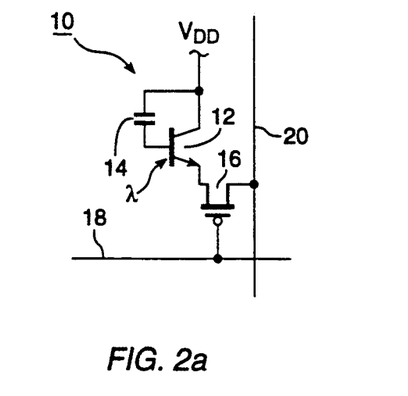
FIG. 2a is a schematic diagram of an integrating photosensor according to a presently-preferred embodiment of the invention.

Referring now to FIG. 2a, a presently preferred pixel integrating photosensor circuit 10 suitable for use in a single-chip integrated circuit imaging array is shown. The photosensor circuit 10 includes NPN phototransistor 12, having its collector connected to a source of positive voltage, shown as $V_{DD}$ in FIG. 2a. The intrinsic base-collector capacitance of phototransistor 12 is shown explicitly as capacitor 14. Those of ordinary skill in the art will recognize that, if a larger value of capacitance is desired, an additional capacitor may be fabricated in parallel with the intrinsic base-collector capacitance. NPN phototransistor 12 preferably has a current gain larger than 100.

Integrating photosensor circuit 10 also includes P-channel MOS pass transistor 16, having its gate connected to a row-select line 18, its source connected to the emitter of phototransistor 12, and its drain connected to column sense line 20.

In a preferred implementation of the invention, a plurality of photosensor circuits 10 are formed in an N-well in a standard N-well CMOS integrated circuit fabrication process, with the single addition of a p type base diffusion step. The N-channel source-drain diffusion is used as the emitter of the phototransistor 12, enclosed within a base region formed by the p base diffusion. The collector of the phototransistor is formed by the N-well, and covers the entire photosensor array. Pass transistor 16 is also formed in the N-well and thus must be a p-channel MOS transistor. Because the N-well diffusion covers the entire photosensor array, the individual pixel circuits can be very dense since there are no large well-to-well spacing distances which waste semiconductor substrate area.

Figure 2B:
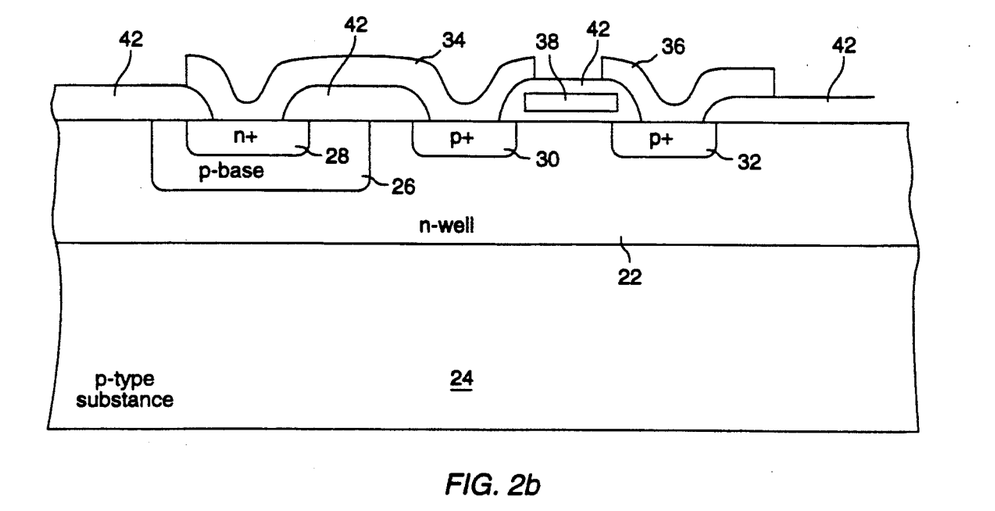
FIG. 2b is a cross sectional view of an embodiment of the circuit of FIG. 2a implemented in an N-well CMOS process.

Referring now to FIG. 2b, a cross section of a presently preferred embodiment of a photosensor circuit 10 in an N-well CMOS process is shown. The entire array of photosensors 10 is fabricated in N-well 22 formed in semiconductor substrate 24. N-well 22 forms the collector of phototransistor 12. A p-type region 26 in N-well 22 forms the base of phototransistor 12 and an n+ region 28 in p-type base region 26 forms the emitter of phototransistor 12.

Diffused p-type regions 30 and 32 form the source and drain, respectively of P-channel MOS pass transistor 16. A first metal line 34 connects emitter region 28 of phototransistor 12 to source region 30 of P-channel MOS pass transistor 16. A second metal line 36 connected to drain region 32 of P-channel MOS pass transistor 16 forms column sense line 20. Finally, polysilicon gate 38 forms row line 18. Insulating layer 42 isolates first and second metal lines 34 and 36 and polysilicon gate 38 from other circuit elements In a typical implementation in a one micron CMOS process, NPN phototransistor 12 may have a base region about 7 microns by 10 microns and P-channel pass transistor 16 may be about 3 microns wide and have a channel length of about 1 micron The entire pixel is 13 microns by 13 microns, allowing for a highly dense array and making it competitive with the high quality CCD imager circuits.

During normal circuit operation, sense line 20 is held at a fixed voltage, typically 1.5 volts below the collector voltage of phototransistor 12. For the entire frame time except that period when the pixel is being sensed, row-select line 18 is held at or near $V_{DD}$, thereby turning off pass transistor 16 and effectively isolating the emitter of phototransistor 12 from sense line 20. As photogenerated carriers are collected by the base of phototransistor 12, the base-collector capacitor 14 becomes more positively charged because no base-to-emitter current is allowed to flow. The photocurrent is thus integrated on the base-collector capacitance over this time period.

When it is desired to sense the charge accumulated in base-collector capacitor 14, row-select line 18 is abruptly driven low, thereby turning on P-channel pass transistor 16. The voltage on the emitter of phototransistor 12 is driven rapidly to the voltage on sense line 20, thereby forward biasing the emitter base junction of phototransistor 12. The integrated charge stored on the base of phototransistor 12 is discharged into the base terminal of phototransistor 12, and a current equal to the base current multiplied by the current gain of phototransistor 12 is delivered to sense line 20.

Because the discharge occurs very rapidly, phototransistor 12 is operated at much higher currents than the photocurrent. At this higher current level, the current gain of phototransistor 12 is much higher than unity as shown in FIG. 1 The mode of operation contemplated by the present invention thereby allows many charge carriers to be delivered to sense line 20 for every photo-generated carrier collected by the base.

Figure 3:
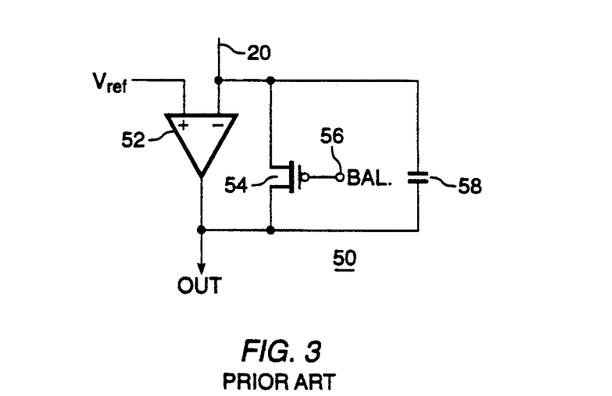
FIG. 3 is a prior art sense amplifier suitable for use in the present invention.

Referring now to FIG. 3, a typical integrating sense amplifier 50 suitable for sensing the charge delivered to sense line 20 by a single pixel is shown. Sense amplifier 50 includes an amplifying element 52, which may be an operational amplifier. The non-inverting input of amplifier 52 is connected to a source of reference voltage $V_{ref}$ and its inverting input is connected to sense line 20.

A P-channel balance transistor 54 is connected between the inverting input and the output of amplifier 52. Its gate is connected to a balance line 56. A capacitor 58 is also connected between the inverting input and output of amplifier 52.

Before row select line 18 is brought low to read a pixel value, amplifier 52 is brought into a known state by bringing the gate of p-channel balance transistor 54 low to turn it on, thereby effectively shorting the inverting input of amplifier 52 to its output and hence driving both input and output voltages to reference voltage $V_{ref}$. The gate of P-channel balance transistor 54 is then brought high, thereby isolating the input sense line 20 from the output of amplifier 52. The pixel is then addressed by bringing its row select line low, thus delivering its stored charge multiplied by the current gain of its phototransistor onto sense line 20.

Amplifier 52 will respond to this charge by maintaining its input at a nearly constant level by the feedback action of capacitor 58. The output voltage of amplifier 52 after the pixel has delivered all of its charge to sense line 20 will be lower than its initial value by that charge divided by the value of capacitor 58.

Figure 4A:
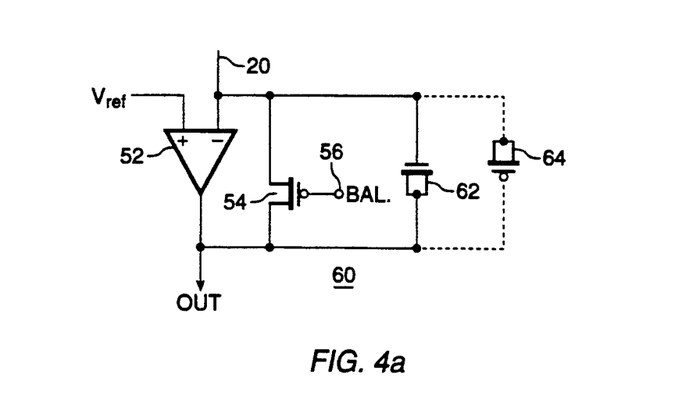
FIG. 4a is a schematic diagram of a presently preferred sense amplifier for use in the present invention which provides signal compression.

The operation of the imaging array of the present invention at high light levels may be improved by using the sense amplifier shown in FIG. 4a. Sense amplifier 60 includes most of the elements of sense amplifier 50. These elements have been assigned the same reference numerals as the corresponding elements of FIG. 3. Thus, sense amplifier 60 includes an amplifying element 52, having its non-inverting input connected to a source of reference voltage $V_{ref}$ and its inverting input connected to sense line 20. P-channel balance transistor 54 is connected between the inverting input and the output of amplifier 52. Its gate is connected to a balance line 56.

However, in place of capacitor 58, a varactor structure is connected between the inverting input and output of amplifier 52 in the sense amplifier of FIG. 4a. Use of a varactor structure in place of capacitor 58 allows compression of the output signal over a wide dynamic range. As known in the art, and as illustrated in FIG. 4a, a varactor structure may comprise a large-area MOS transistor. The gate of the MOS transistor comprises one terminal of the varactor structure and the other terminal of the varactor structure comprises the source and drain of the MOS transistor connected together.

Either an N-channel MOS transistor or a P-channel MOS transistor may be used as the varactor according to the present invention. Because, in the illustrated embodiment, it is assumed a positive charge is to be sensed, if an N-channel MOS transistor is used as the varactor as indicated at reference numeral 62, its gate is connected to the input of amplifying element 52 and its source and drain are connected to the output of amplifying element 52. If a P-channel MOS transistor is used as the varactor as indicated at reference numeral 64 in phantom connection, its source and drain are connected to the input of amplifying element 52 and its gate is connected to the output of amplifying element 52. If a charge of the opposite sign is to be sensed, those of ordinary skill in the art will realize that the connections to the varactor will be reversed. If an application requires sensing charge of both polarities, two varactors connected in opposite directions may be used.

Figure 4B:
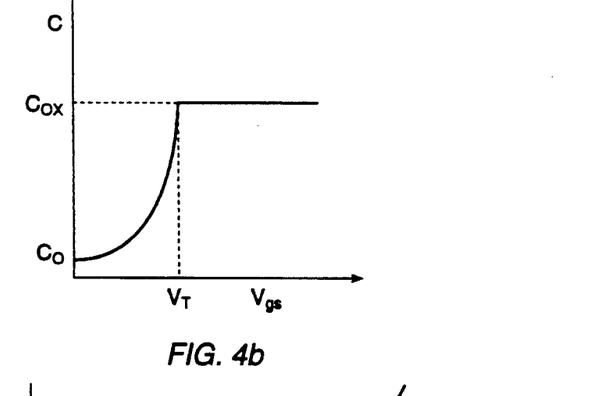
FIG. 4b is a graph showing the capacitance of the varactor structure of the sense amplifier of FIG. 4a as a function of voltage.

Referring now to FIG. 4b, a graph of varactor capacitance as a function of $V_{GS}$, the voltage across the capacitor, it may be seen that the capacitance from one terminal of the varactor structure to its other terminal varies with the voltage across the varactor device. At low gate to source voltages, the capacitance $C_0$ is small and is determined by the overlap of the gate with the source and drain diffusions. As the gate voltage approaches the threshold voltage $V_t$ of the MOS transistor, a channel begins to form under the gate, and the capacitance increases exponentially. Above the threshold voltage, the capacitance reaches the maximum value $C_{ox}$ set by the oxide capacitance of the entire area of the MOS transistor.

According to the present invention, the varactor is oriented in sense amplifier 60 such that the capacitance increases as the input charge increases. For this reason, the output voltage of the sense amplifier 60 per unit photosensor charge is a decreasing function of the total charge sensed. For example, for the NPN phototransistor of FIG. 2a, a positive charge is sensed at the input of sense amplifier 60, causing the amplifier output to go negative from its balanced value.

Figure 5:
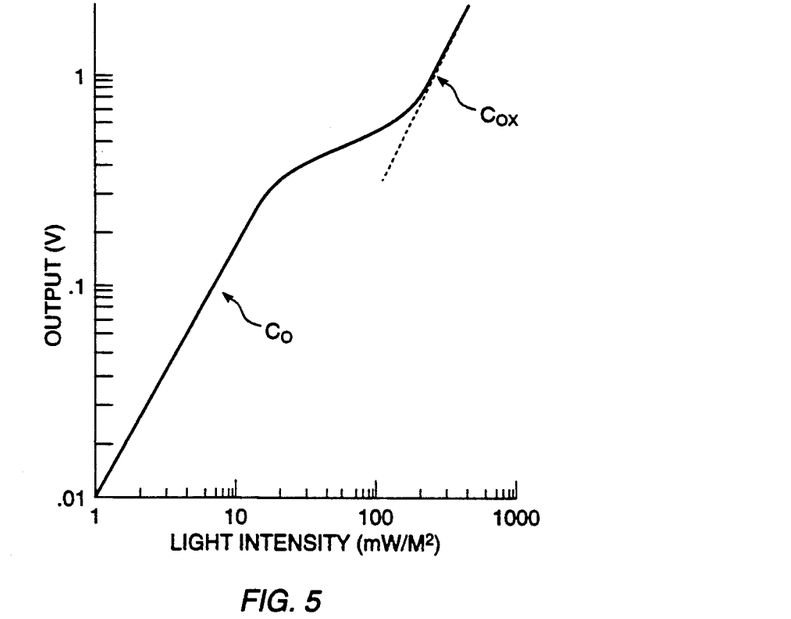
FIG. 5 is a graph showing the output voltage of the sense amplifier of FIG. 4a as a function of light intensity.

Referring now to FIG. 5, a graph of the output voltage of the sense amplifier 60 of FIG. 4a is shown as a function of light intensity. The voltage (Y) axis is calibrated in volts and the light-intensity (X) axis is calibrated approximately in mW/meter$^2$. The region past the knee of the curve in the graph of FIG. 5 represents the region where the capacitance of the varactor is increasing towards the value of $C_{ox}$. Varying the size of the varactor device will translate the curve along the X-axis. Reducing the minimum capacitance $C_0$ will translate the lower portion of the curve to the left. The horizontal displacement of the upper and lower portions of the curve of FIG. 5 is equal to the ratio of $C_{ox}$ to $C_0$.

As the level of light intensity is increased further, the upper portion of the curve of FIG. 5 will steepen to a slope of 1 on the log-log scale of FIG. 5. To prevent this return to non-compressive behavior, the operation of the imaging array of the present invention at high light levels may be improved by using the sense amplifier shown in FIG. 6a. Sense amplifier 70 includes all of the elements of sense amplifier 60. These elements have been assigned the same reference numerals as the corresponding elements of FIG. 4a.

Figure 6A:
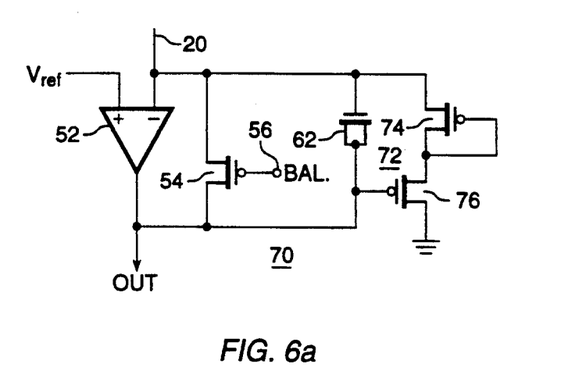
FIG. 6a is a schematic diagram of an alternative sense amplifier for use in the present invention incorporating a first exponential feedback element.

As may be seen from FIG. 6a, in addition to the elements of the sense amplifier circuit 60 of FIG. 4a, sense amplifier 70 includes an exponential feedback element 72. In a first embodiment, exponential feedback element 72 of sense amplifier 70 includes first and second P-channel feedback transistors 74 and 76. First P channel feedback transistor 74 has its source connected to sense line 20, and its gate and drain connected together to the source of second P-channel feedback transistor 76. The gate of second P-channel feedback transistor 76 is connected to the output of amplifier 52, and its drain is connected to a fixed voltage source, shown as ground in FIG. 6a.

The effect of first and second P-channel feedback transistors 74 and 76 is to provide a current which increases exponentially as the output voltage of amplifier 52 becomes more negative. This exponential function has a very small slope for output voltage excursions less than approximately 1 volt, thereby allowing sense amplifier 70 to function as a normal charge-sensing amplifier at low light levels. However, at higher light levels, by virtue of the current through the exponential element, sense amplifier 70 becomes a current-sensing amplifier, and its output voltage decreases as a logarithmic function of the input current from the pixel.

Those of ordinary skill in the art will recognize that the sense amplifier circuit of FIG. 6a automatically acts as both an integrating detector at low light levels, and as a current-mode detector at high light levels. The dynamic range of an imaging array may be greatly increased by use of the sense amplifier circuit of FIG. 6a.

Figure 6B:
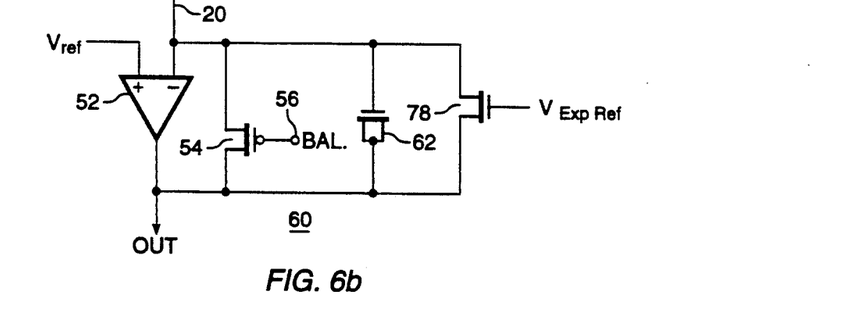
FIG. 6b is a schematic diagram of an alternative sense amplifier for use in the present invention incorporating a second exponential feedback element.

Referring now to FIG. 6b, an alternate embodiment of a sense amplifier with an exponential feedback element to improve its dynamic range is shown. The sense amplifier of FIG. 6b includes all of the elements of sense amplifier 70. These elements have been assigned the same reference numerals as the corresponding elements of FIG. 3. Thus, the sense amplifier of FIG. 6b includes an amplifying element 52, having its non-inverting input connected to a source of reference voltage $V_{ref}$ and its inverting input connected to sense line 20. P-channel balance transistor 54 is connected between the inverting input and the output of amplifier 52. Its gate is connected to a balance line 56. Varactor 62 is connected between the output and inverting input of amplifying element 52.

N-channel MOS transistor 78 is connected as an exponential feedback element with its source connected to the output of amplifying element 52 and its drain connected to the inverting input of amplifying element 52. Its gate is connected to a source of fixed voltage. $V_{Exp\ Ref}$. As more positive charge is sensed by amplifying element 52, its output becomes more negative. As the output decreases below $V_{Exp\ Ref}$, the current through MOS transistor 78 begins to increase exponentially with decreasing output voltage. The amplifier then becomes a current-sensing amplifier with an output voltage logarithmic in input voltage. The magnitude of the fixed voltage source $V_{Exp\ ref}$ should be chosen such that the logarithmic compression occurs just as the varactor has achieved its maximum capacitance $C_{ox}$.

Figure 7A:
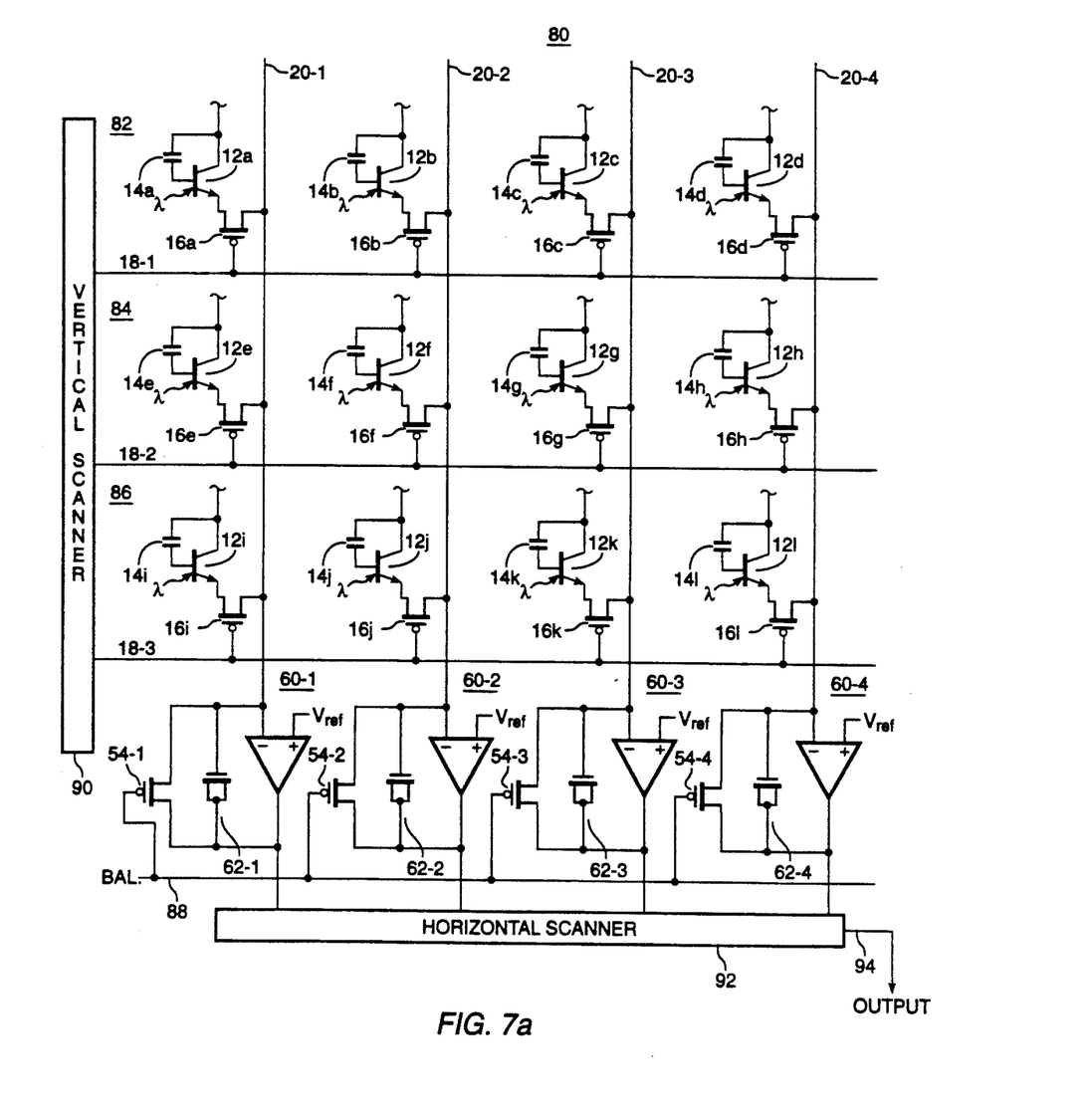
FIG. 7a is a block diagram of an imaging array comprising bipolar transistor integrating photosensors according to a presently preferred embodiment of the invention.

Referring now to FIG. 7a, an integrating imaging array according to a presently preferred embodiment of the invention is illustrated. The array 80 of FIG. 7a is shown including twelve integrating photosensors according to the present invention arranged into three rows and four columns. Those of ordinary skill in the art will readily observe that the embodiment shown in FIG. 7a is illustrative and not limiting in nature, and that an array of any size is contemplated by the present invention, limited only by the inherent density and chip size limitations of CMOS technology.

Row 82 of array 80 includes photosensors 12a–12d. Row 84 of array 80 includes photosensors 12e–12h. Row 86 of array 80 includes photosensors 12i–12l. In FIG. 7a, photosensors 10 are illustrated as bipolar phototransistors. Those of ordinary skill in the art will recognize that other integrating photosensor elements may be used in place of phototransistors.

First row line 18-1 is connected to the gates of P-channel transistors 16a–16d. Second row line 18-2 is connected to the gates of P-channel transistors 16e–16h. Third row line 18-3 is connected to the gates of P-channel transistors 16i–16l. First sense line 20-1 is connected to the drains of P-channel transistors 16a, 16e, and 16i of the first column in the array 80. Second sense line 20-2 is connected to the drains of P-channel transistors 16b, 16f, and 16j of the second column in the array 80. Third sense line 20-3 is connected to the drains of P-channel transistors 16c, 16g, and 16k of the third column in the array 80. Fourth sense line 20-4 is connected to the drains of P-channel transistors 16d, 16h, and 16l of the fourth column in the array 80.

First sense amplifier 60-1 is connected to first sense line 20-1. Second sense amplifier 60-2 is connected to second sense line 20-2. Third sense amplifier 60-3 is connected to third sense line 20-3. Fourth sense amplifier 60-4 is connected to fourth sense line 20-4. As will be apparent from the discussion accompanying FIG. 2a, a row of pixels from array 80 may be read by pulsing balance line 88, followed by bringing the desired one of row lines 18-1 through 18-3 to a low logic level. Sense amplifiers 60-1 through 60-4 may be any of the sense amplifiers disclosed herein, or may be any other appropriate sense amplifier which those of ordinary skill in the art will be readily able to select.

In a presently preferred embodiment, a vertical scanning circuit 90 is adapted to select only one of the row select lines 18 at any given time. Circuits for performing this function are well known in the art. In a true serial scanned imager, horizontal scanning circuitry 92 is adapted to select the signal from the output of one of amplifiers 60 at a given time, to form the output 94 of the array. Exemplary scanning circuits suitable for use as vertical and horizontal scanning circuits 90 and 92 are described in *Analog VLSI and Neural Systems*, by Carver A. Mead, Addison Wesley Publishing Co., 1989, at pp 263-267. If parallel outputs are desired, all or a subset of amplifier outputs can be used directly without employing horizontal scanning circuit 92.

Figure 7B:
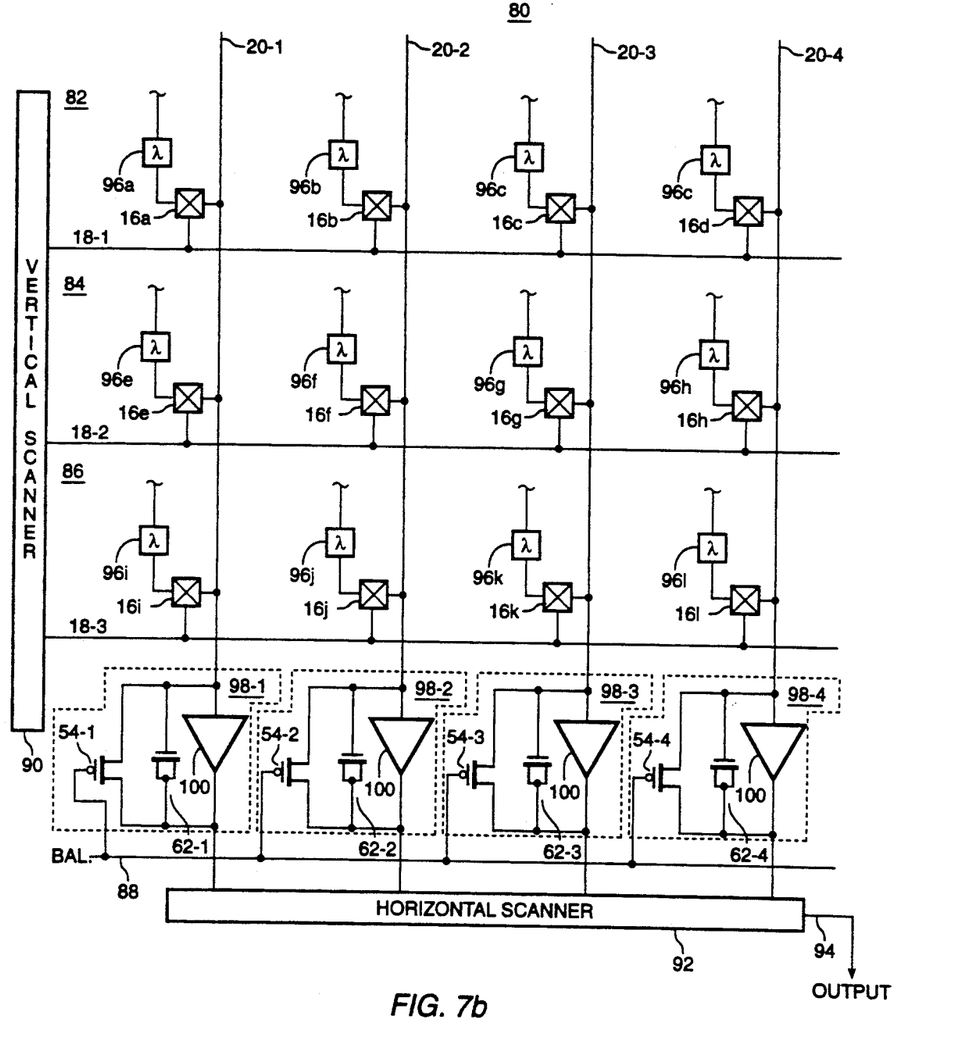
FIG. 7b is a block diagram of an imaging array comprising integrating photosensors according to a presently preferred embodiment of the invention.

Referring now to FIG. 7b, a block diagram of a more generalized version of an integrating imaging array according to the present invention is depicted. Integrating photosensors 96a–96l are shown as rectangular boxes. Those of ordinary skill in the art will readily understand that integrating photosensors 96a–96l may comprise phototransistors, photodiodes and other integrating photosensor elements. The array structure of the array of FIG. 7b is otherwise much the same as that of the array of FIG. 7a.

Switching elements 16a–16l act to connect the elements of the single row selected by row scanner 90 to the column lines 20-1 through 20-4. Numerous circuit elements, such as single MOS transistors, junction FETs, and bipolar transistors, etc., may be used as switching elements 16a–16l. In some embodiments, the bipolar phototransistor itself can be used as a switch for its own current output.

In addition, sense amplifiers 98-1 through 98-4 are also shown generically including amplifying elements 100. Persons of ordinary skill in the art will appreciate that sense amplifiers 98-1 to 98-4 (shown within dashed lines) may be any of the sense amplifiers disclosed in FIGS. 3, 4a, 6a, and 6b herein, or may be other appropriate sense amplifiers which those of ordinary skill in the art will be able to select. Although sense amplifiers 98-1 through 98-4 are shown including MOS balance transistors 54-1 through 54-4 and varactor elements 62-1 through 62-4, those of ordinary skill in the art will recognize that the exponential feedback functions may be omitted or can be achieved by other means.

The remaining elements of the integrating imaging array of FIG. 7b are the same as the corresponding elements of the integrating imaging array of FIG. 7a.

The integrating imaging array of FIG. 7b functions in the manner described for the array of FIG. 7a.

While a presently-preferred embodiment of the invention has been disclosed, those of ordinary skill in the art will, from an examination of the within disclosure and drawings be able to configure other embodiments of the invention. For example, those of ordinary skill in the art will readily observe that the array of the present invention may be rearranged by a simple rotation to interchange the roles of its rows and its columns, and that it may be easily fabricated in a P-well in a P-well CMOS process, and that, in such an embodiment, the voltage levels and power supplies would be reversed. These other embodiments are intended to fall within the scope of the present invention which is to be limited only by the scope of the appended claims.

What is claimed is:

1. A charge sense amplifier, including:
    an input node;
    an output node;
    an inverting amplifying element including an input connected to said input node, and an output connected to said output node;
    an MOS transistor having its gate connected to said input of said amplifying element and its source and drain connected to said output of said amplifying element.

2. The charge sense amplifier of claim 1, further including means for selectively connecting said output node to said input node.

3. The charge sense amplifier of claim 1 wherein said means for selectively connecting comprises an MOS connecting transistor connected between said input node and said output node, said MOS connecting transistor having its gate connected to a balance input node.

4. The charge sense amplifier of claim 1, wherein said amplifying element further includes a non-inverting input connected to a source of reference voltage.

5. The charge sense amplifier of claim 1, further including means for providing a feedback current to the input of said inverting amplifying element which is an exponential function of the output voltage of said inverting amplifying element.

6. The charge sense amplifier of claim 1, further including an MOS feedback transistor connected as an exponential feedback element between said input and said output of said inverting amplifying element, the gate of said MOS feedback transistor connected to a fixed voltage source having a magnitude selected to set a desired feedback characteristic for said sense amplifier.

7. A charge sense amplifier, including:
    an input node;
    an output node;
    an inverting amplifying element including an input connected to said input node, and an output connected to said output node;
    a MOS transistor having its gate connected to said output of said amplifying element and its source and drain connected to said input of said amplifying element.

8. The charge sense amplifier of claim 7, further including means for selectively connecting said output node to said input node.

9. The charge sense amplifier of claim 8 wherein said means for selectively connecting comprises an MOS connecting transistor connected between said input node and said output node, said MOS connecting transistor having its gate connected to a balance input node.

10. The charge sense amplifier of claim 7, wherein said amplifying element further includes a non-inverting input connected to a reference voltage.

11. The charge sense amplifier of claim 7, further including means for providing a feedback current to the input of said inverting amplifying element which is an exponential function of the output voltage of said inverting amplifying element.

12. The charge sense amplifier of claim 7, further including an MOS feedback transistor connected as an exponential feedback element between said input and said output of said inverting amplifying element, the gate of said MOS feedback transistor connected to a fixed voltage source having a magnitude selected to set a desired feedback characteristic for said sense amplifier.

13. The charge sense amplifier of claim 1 further including:
    a first P-Channel MOS feedback transistor having a source connected to said input node, and a drain and a gate connected together;
    a second P-Channel MOS feedback transistor having a gate connected to said output node, a source connected to said drain of said first feedback transistor, and a drain connected to a fixed voltage source.

* * * * *

UNITED STATES PATENT AND TRADEMARK OFFICE
CERTIFICATE OF CORRECTION

PATENT NO. : 5,276,407
DATED : January 4, 1994
INVENTOR(S) : Carver A. Mead, Federico Faggin It is certified that error appears in the above-indentified patent and that said Letters Patent is hereby corrected as shown below:

Column 2, line 54, replace "P channel" with --P-channel,--.

Column 4, line 4, replace "P channel" with --P-channel,--.

Column 4, line 65, after "FIG. 1" insert --.--.

Column 7, line 58, replace "10" with --12i-12l--.

Signed and Sealed this

Twenty-fifth Day of June, 1996

*Attest:*

BRUCE LEHMAN

*Attesting Officer*  Commissioner of Patents and Trademarks